United States Patent
Chiou

(10) Patent No.: US 7,480,043 B2
(45) Date of Patent: Jan. 20, 2009

(54) METHOD FOR ANALYZING THE RELIABILITY OF OPTOELECTRONIC ELEMENTS RAPIDLY

(75) Inventor: Yu-Zung Chiou, Tainan (TW)

(73) Assignee: Southern Taiwan University of Technology, Tainan (TW)

( * ) Notice: Subject to any disclaimer, the term of this patent is extended or adjusted under 35 U.S.C. 154(b) by 89 days.

(21) Appl. No.: 11/594,844

(22) Filed: Nov. 9, 2006

(65) Prior Publication Data
US 2007/0268038 A1 Nov. 22, 2007

(30) Foreign Application Priority Data
May 17, 2006 (TW) .............................. 95117387 A

(51) Int. Cl.
*G01J 3/00* (2006.01)
(52) U.S. Cl. .................................................... 356/300
(58) Field of Classification Search ................. 356/300; 324/753, 767
See application file for complete search history.

(56) References Cited
U.S. PATENT DOCUMENTS 5,381,103 A * 1/1995 Edmond et al. ............. 324/753
6,384,612 B2 * 5/2002 Freund et al. ............... 324/750
7,064,832 B2 * 6/2006 Rogers ....................... 356/406

\* cited by examiner

*Primary Examiner*—Kara E Geisel
(74) *Attorney, Agent, or Firm*—Muncy, Geissler, Olds & Lowe, PLLC

(57) ABSTRACT

A method for analyzing the reliability of optoelectronic elements rapidly is described. A plurality of optoelectronic elements are tested and measured by a spectrum analyzer to obtain noise equivalent power (NEP) and peak of noise power spectrum of each optoelectronic element at a frequency. An electrical cycle test is performed by alternately imposing forward bias and reverse bias on the optoelectronic elements with cycles. Then, the spectrum analyzer tests and measures the optoelectronic elements with the electrical cycle test at the frequency to determine whether the NEP and peak of noise power spectrum of the optoelectronic elements with the electrical cycle test are higher than those of optoelectronic elements without the electrical cycle test. Furthermore, the NEP and peak of noise power spectrum of the optoelectronic elements with the electrical cycle test are compared with the statistic standard deviation to obtain the optoelectronic elements having reliability problems.

8 Claims, 3 Drawing Sheets

METHOD FOR ANALYZING THE RELIABILITY OF OPTOELECTRONIC ELEMENTS RAPIDLY

RELATED APPLICATIONS

The present application is based on, and claims priority from, Taiwan Application Serial Number 95117387, filed May 17, 2006, the disclosure of which is hereby incorporated by reference herein in its entirety.

FIELD OF THE INVENTION

The present invention relates to a method for analyzing the reliability of optoelectronic elements rapidly, and more particularly, to a rapid reliability test that can be generally applied to optoelectronic elements, in which the quality of the optoelectronic elements which have been proceeded with the electrical cycle test can be rapidly determined according to the noise equivalent power (NEP) and peak of noise power spectrum of the optoelectronic elements at the low frequency.

BACKGROUND OF THE INVENTION

In the light of the production of diode chips, Taiwan has an important position in the world. In order to continuously compete with other countries, a more rapid production module is required to reduce the developing and manufacturing duration of the product to grasp the time for entering the market and shipping, so as to expand the competition and the market of the products in the international market. The fabrication of diode chips includes the steps of epitaxially manufacturing of the wafer, electrically probing of the wafer, sawing the wafer and the reliability test. However, the current methods for the reliability analysis of the diode chips need to take couple days and the process is very complicated, thereby easily resulting in ineffective shipping for mass production.

As shown in FIG. 3, in the reliability analysis of optoelectronic elements, a reliability test is mainly performed with an oven 3, in which the optoelectronic elements are exposed to humidity and alternate variable temperature cycles of high temperature and low temperature for several days or several months to accelerate the damage to the optoelectronic elements and to rapidly reduce the life of the optoelectronic elements to achieve the reliability analysis of the optoelectronic elements.

However, the disadvantages of the reliability analysis of the optoelectronic elements include:

1. It takes very long time for the current reliability analysis of the optoelectronic elements.

2. The current reliability analysis of the optoelectronic elements will be destructive to the elements.

In view of the above, the inventor provides a testing method, which is very rapid and is not destructive, for reliability analysis of the optoelectronic elements to overcome the disadvantages of the current reliability analysis.

SUMMARY OF THE INVENTION

The present invention relates to a method for analyzing the reliability of optoelectronic elements rapidly. In the present invention, the sampling optoelectronic elements are imposed with the appropriate forward bias and reverse bias to generate alternate cycles of positive currents and negative currents. Then, the optoelectronic elements are proceeded with appropriate iteration cycles, cycle time and duty cycles. Next, the spectrum analyzer tests and measures the optoelectronic elements which have been proceeded with the electrical cycle test to determine whether the NEP and peak of noise power spectrum of the optoelectronic elements at the low frequency with the electrical cycle test are increased. The NEP and peak of noise power spectrum of the optoelectronic elements at the low frequency after the electrical cycle test are compared with the statistic standard deviation to find out the optoelectronic elements that have reliability problems, and to achieve rapid analysis of the reliability.

DETAILED DESCRIPTION OF THE PREFERRED EMBODIMENT

The foregoing aspects and many of the attendant advantages of this invention are more readily appreciated as the same become better understood by reference to the following detailed description, when taken in conjunction with the accompanying drawings.

Figure 1:
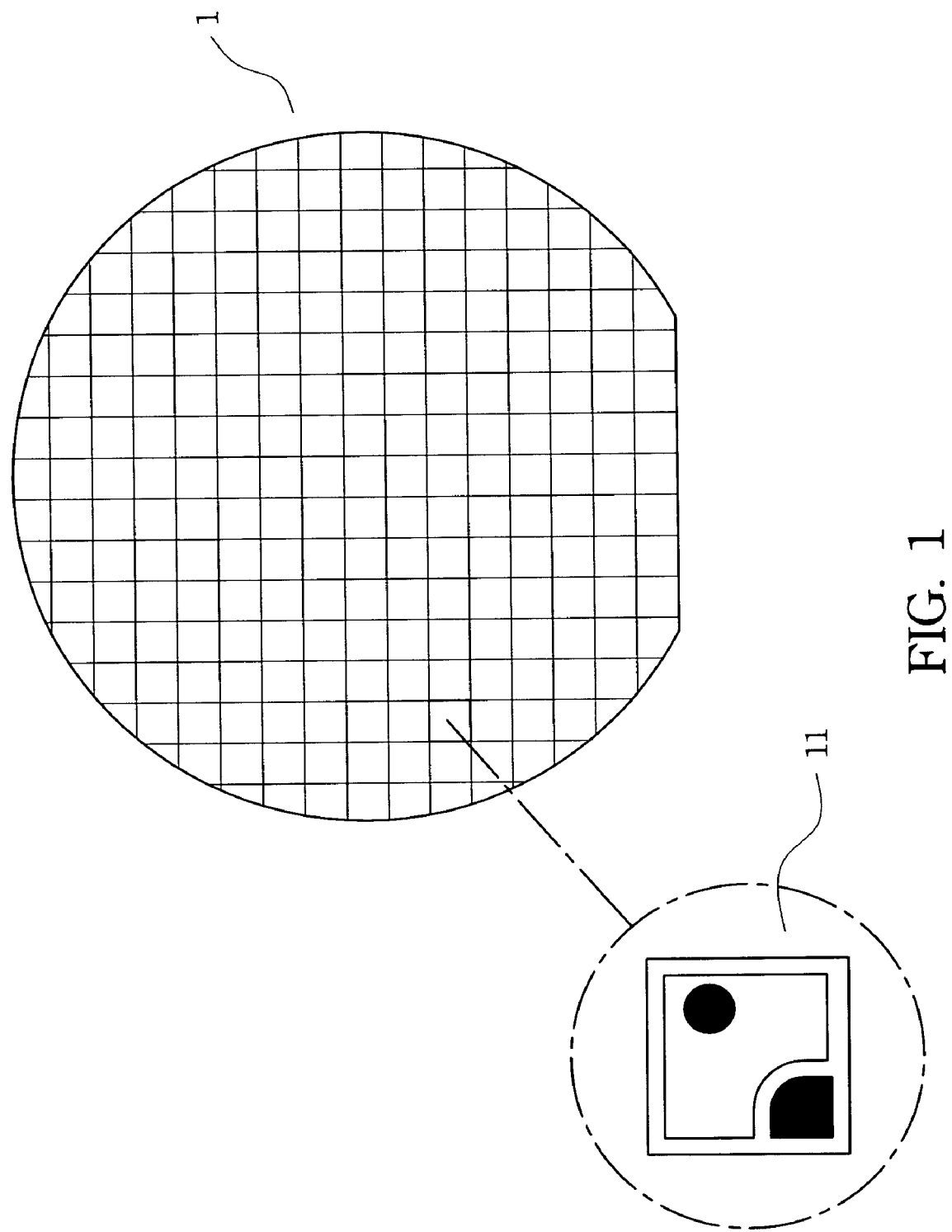
FIG. 1 is a schematic diagram showing a test wafer in accordance with a preferred embodiment of the present invention.
Figure 2:
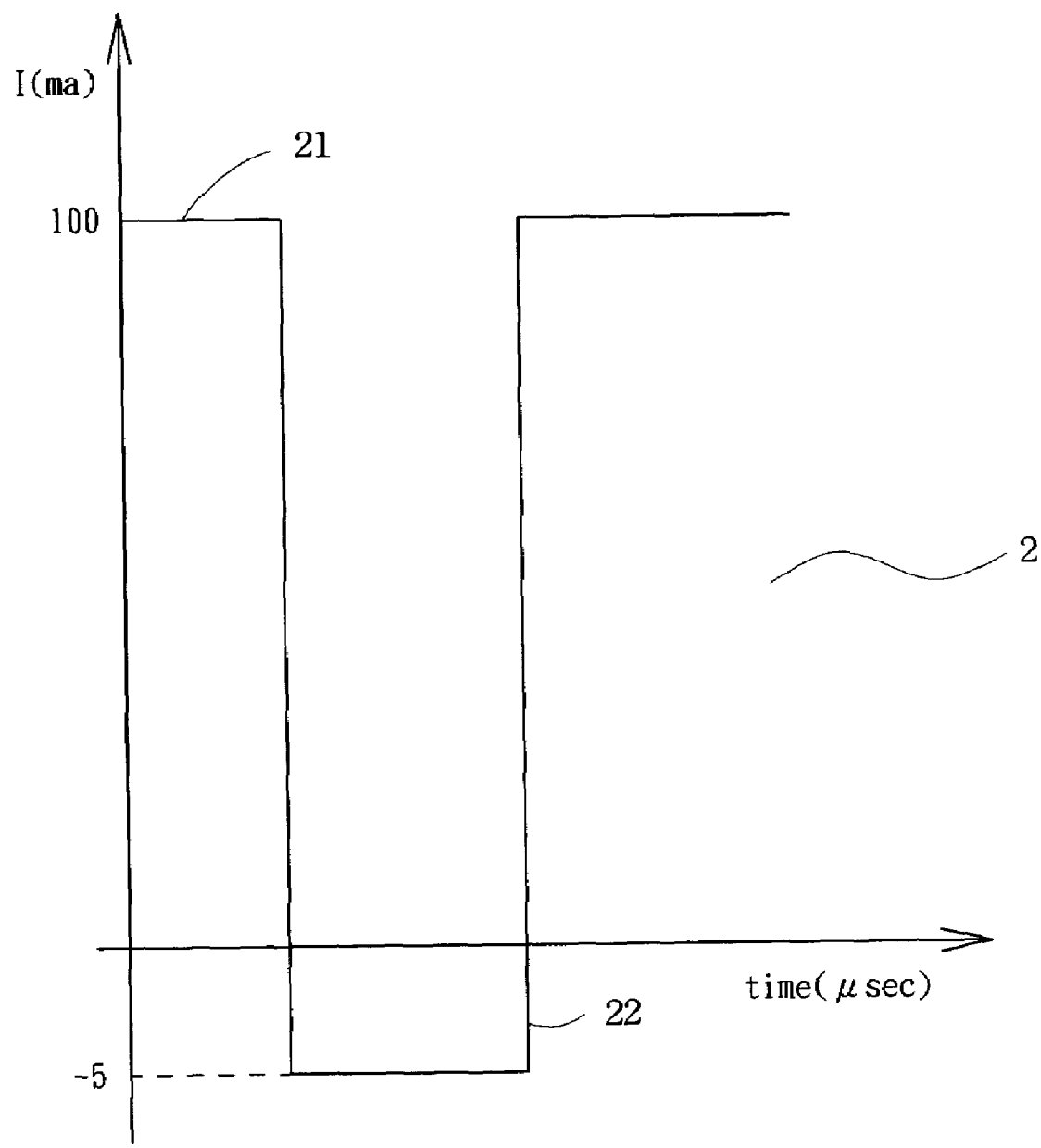
FIG. 2 illustrates a diagram of curves showing the relationship between time and current applied to optoelectronic elements for reliability analysis in accordance with a preferred embodiment of the present invention.
Figure 3:
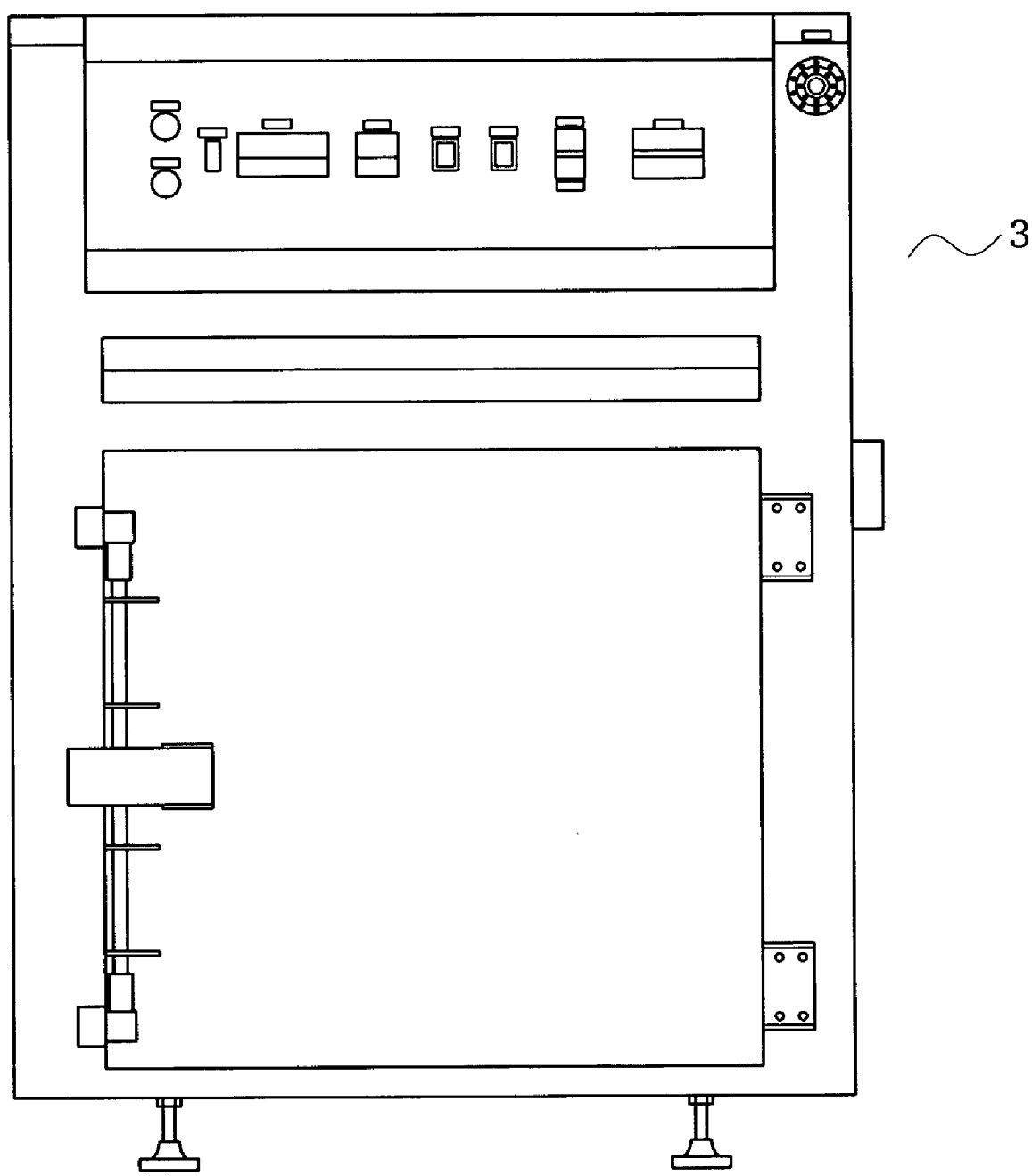
FIG. 3 is a schematic diagram showing a conventional apparatus for testing the reliability of optoelectronic elements.

Refer to FIG. 1 and FIG. 2. In the method used for analyzing the reliability of optoelectronic elements rapidly of the present invention, one hundred optoelectronic elements 11 which are good elements determined by the electrical probing test are taken out from a wafer 1 to be testing pieces for rapid reliability analysis. Each optoelectronic element 11 is 300 µm in length and 300 µm in width. A spectrum analyzer is used to test and measure NEP and peak of noise power spectrum of the optoelectronic elements 11 at a low frequency, wherein the NEP, the peak of noise power spectrum, and the multiplication product of the NEP and the peak of noise power spectrum of each optoelectronic element respectively respect three standard values. Then, the optoelectronic elements 11 are imposed with the forward bias and reverse bias to generate alternate cycle 2 of positive currents 21 of 100 mA and negative currents 22 of −5 mA. As shown in FIG. 2, the ratio of the duty cycles of the square waves of the current 21 of 100 mA and the square waves of the current 22 of −5 mA is 1:1, and each of the duty cycles of the square waves of the current 21 of 100 mA and the square waves of the current 22 of −5 mA is 5 µs. In a preferred embodiment, the alternate cycle 2 is carried out over $10^7$ cycles. Then, the spectrum analyzer tests and measures the NEP and peak of noise power spectrum of the optoelectronic elements 11, at the low frequency, and the NEP, the peak of noise power spectrum and the multiplication product of the NEP and the peak of noise power spectrum of the optoelectronic elements 11 are compared with the aforementioned standard values. Next, distributed curves are illustrated according to the relations between the NEP and the number of the optoelectronic elements, the peak of noise power spectrum and the number of the optoelectronic elements, and the multiplication product of the NEP and the peak of noise power spectrum and the number of the optoelectronic elements. A statistic standard deviation method is used to determine which optoelectronic element 11 is good and which optoelectronic element 11 has reliability problems, wherein fifth standard deviation is the abnormal criterion. With the application of the present method, a rapid analysis of the reliability is achieved. The method is not a destructive test and has high accuracy. The optoelectronic elements 11 may be light-emitting diode chips.

According to the aforementioned description, advantages of the present invention includes:

1. With the application of the rapid reliability analysis of the optoelectronic elements of the present invention, the time of the reliability analysis can be decreased from several days to one hour, so that the shipping time of the products can be effectively reduced.

2. The rapid reliability analysis of the optoelectronic elements of the present invention can be directly applied to the producing line to accurately find out the optoelectronic elements having some problems of the reliability in the producing line.

3. The rapid reliability analysis of the optoelectronic elements of the present invention is not destructive to the optoelectronic element chips.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A method for analyzing the reliability of optoelectronic elements rapidly, comprising:
   (a) performing a first testing and measuring step on a plurality of optoelectronic elements by a spectrum analyzer to obtain noise equivalent power (NEP) and peak of noise power spectrum of each optoelectronic element at a frequency;
   (b) alternately applying positive currents and negative currents to the optoelectronic elements to form cycles;
   (c) performing a second testing and measuring step on the optoelectronic elements by the spectrum analyzer to obtain noise equivalent power (NEP) and peak of noise power spectrum of each optoelectronic element at the frequency; and
   (d) comparing the noise equivalent power (NEP) and the peak of noise power spectrum of each optoelectronic element obtained in the first testing and measuring step with the noise equivalent power (NEP) and the peak of noise power spectrum of each optoelectronic element obtained in the second testing and measuring step, thereby obtaining the optoelectronic elements having reliability problems.

2. The method for analyzing the reliability of optoelectronic elements rapidly according to claim 1, wherein the optoelectronic elements having reliability problems are obtained by determining the noise equivalent power (NEP) of each optoelectronic element obtained in the first testing and measuring step and the noise equivalent power (NEP) of each optoelectronic element obtained in the second testing and measuring step with a statistic standard deviation method.

3. The method for analyzing the reliability of optoelectronic elements rapidly according to claim 2, wherein the optoelectronic elements are light-emitting diode chips.

4. The method for analyzing the reliability of optoelectronic elements rapidly according to claim 1, wherein the optoelectronic elements having reliability problems are obtained by determining the peak of noise power spectrum of each optoelectronic element obtained in the first testing and measuring step and the peak of noise power spectrum of each optoelectronic element obtained in the second testing and measuring step with a statistic standard deviation method.

5. The method for analyzing the reliability of optoelectronic elements rapidly according to claim 4, wherein the optoelectronic elements are light-emitting diode chips.

6. The method for analyzing the reliability of optoelectronic elements rapidly according to claim 1, wherein the optoelectronic elements having reliability problems are obtained by determining the multiplication product of the NEP and the peak of noise power spectrum of each optoelectronic element obtained in the first testing and measuring step and the multiplication product of the NEP and the peak of noise power spectrum of each optoelectronic element obtained in the second testing and measuring step with a statistic standard deviation method.

7. The method for analyzing the reliability of optoelectronic elements rapidly according to claim 6, wherein the optoelectronic elements are light-emitting diode chips.

8. The method for analyzing the reliability of optoelectronic elements rapidly according to claim 1, wherein the optoelectronic elements are light-emitting diode chips.

* * * * *